United States Patent
Li et al.

(10) Patent No.: US 7,294,526 B2
(45) Date of Patent: Nov. 13, 2007

(54) NANO OPTICAL SENSORS VIA MOLECULAR SELF-ASSEMBLY

(75) Inventors: Zhiyong Li, Mountain View, CA (US); Yong Chen, Redwood City, CA (US); Sean Xiao-An Zhang, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 321 days.

(21) Appl. No.: 10/917,751

(22) Filed: Aug. 12, 2004

(65) Prior Publication Data

US 2005/0040417 A1 Feb. 24, 2005

Related U.S. Application Data

(62) Division of application No. 10/323,139, filed on Dec. 17, 2002, now Pat. No. 6,815,706.

(51) Int. Cl.
*H01L 51/40* (2006.01)
*H01L 21/00* (2006.01)

(52) U.S. Cl. .................. 438/82; 438/57; 257/E21.04; 257/E21.328; 257/14; 257/40

(58) Field of Classification Search .......... 257/E21.04, 257/E21.328, 14, 40; 438/57, 82, 99
See application file for complete search history.

(56) References Cited

U.S. PATENT DOCUMENTS 5,296,719 A 3/1994 Hirai et al.
6,432,740 B1 8/2002 Chen
6,733,828 B2 5/2004 Chao et al.
2002/0050611 A1* 5/2002 Yitzchaik et al. ........... 257/315

OTHER PUBLICATIONS

Cui, Y. et al. SCIENCE. vol. 293 (Aug. 17, 2001): pp. 1289-1292.*
Vilan, A. et al. NATURE. vol. 404 (Mar. 9, 2000): pp. 166-168.*
Yang, J. et al. MICROEL. Eng. vol. 63 (2002): 135-139.*
Cohen, R. et al. Chem. Phys. Lett. vol. 279 (1997): pp. 270-274.*
Aviram, Arieh and Mark A. Ratner, "Molecular Rectifiers", Chemical Physics Letters, vol. 29, No. 2, Nov. 15, 1974, pp. 277-283.
Zenou, Noemi, et al., "Tuving the Electronic Properties of Silicon via Molecular Self-Assembly", Zymposium Series No. 695, American Chemical Society, Chapter 5, pp. 57-66.

* cited by examiner

*Primary Examiner*—B. W. Baumeister
*Assistant Examiner*—Matthew W. Such

(57) ABSTRACT

An optical sensor is provided, comprising (a) a silicon nanowire of finite length having an electrical contact pad at each end thereof; and (b) a plurality of self-assembled molecules on a surface of the silicon nanowire, the molecules serving to modulate electrical conductivity of the silicon nanowire by either a reversible change in dipole moment of the molecules or by a reversible molecule-assisted electron/energy transfer from the molecules onto the silicon nanowire. Further, a method of making the optical sensor is provided. The concept of molecular self-assembly is applied in attaching functional molecules onto silicon nanowire surfaces, and the requirement of molecule modification (hydroxy group in molecules) is minimal from the point view of synthetic difficulty and compatibility. Self-assembly will produce well-ordered ultra-thin films with strong chemical bonding on a surface that cannot be easily achieved by other conventional methods.

22 Claims, 3 Drawing Sheets

FIG. 1a MOLECULAR SELF-ASSEMBLY

FIG. 1b OPTICAL STIMULI

Initial state — UV light / Δ — Activated state

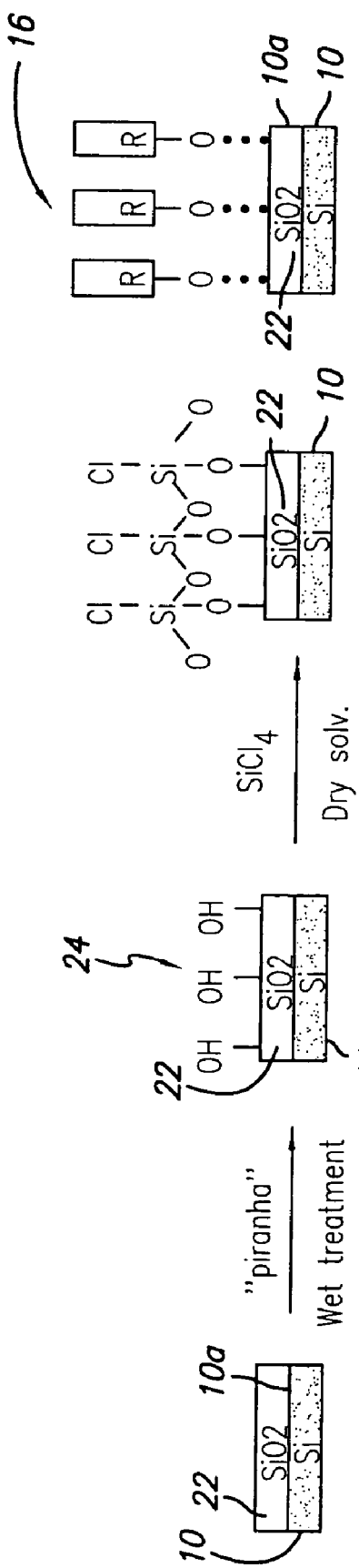

NANO OPTICAL SENSORS VIA MOLECULAR SELF-ASSEMBLY

CROSS-REFERENCE TO RELATED APPLICATION

The present application is a divisional application of application Ser. No. 10/323,139, filed Dec. 17, 2002 now U.S. Pat. No. 6,815,706.

TECHNICAL FIELD

The present invention is directed to nano optical sensors and photodetectors, and, more particularly, to such devices and their fabrication, employing self-assembly of molecules which modulate the electrical conductivity in a silicon nanowire.

BACKGROUND ART

Since the concept of molecular electronics was first proposed in 1974 by Aviram and Ratner (A. Aviram et al, Chemical Physics Letters, Vol. 29, pp. 277-283 (1974)), numerous studies have focused on probing single molecules in terms of using molecules directly as functional electric circuit components such as switches, diodes, or even transistors in replacement of conventional semiconductors, specifically, silicon. On another hand, the interaction of organic species with silicon surfaces remains a topic of considerable extent waiting to be explored, and the ability to tailor the surface electronic properties of silicon by organic or organo-metallic molecules poses a fascinating area hardly conceivable in the past. Cahen and coworkers (N. Zenou et al, ACS Sym. Ser., Vol. 695, pp. 57-66 (1998)) have pointed out that the electronic properties of silicon can be tuned by molecules with different electron-donating or electron-withdrawing groups on the surface. However, the molecules they discussed can only alter the silicon electronic properties once, not in a reversible or tunable fashion.

Thus, the reversible/tunable alteration of the electronic properties of silicon is needed.

DISCLOSURE OF INVENTION

In accordance with the embodiments disclosed herein, an optical sensor is provided. The optical sensor comprises:
  (a) a silicon nanowire of finite length having an electrical contact pad at each end thereof; and
  (b) a plurality of self-assembled molecules on a surface of the silicon nanowire, the molecules serving to modulate electrical conductivity of the silicon nanowire by either a reversible change in dipole moment of the molecules or by a reversible molecule-assisted electron/energy transfer from the molecules onto the silicon nanowire.

Also in accordance with the embodiments disclosed herein a method of making the optical sensor is provided. The method comprises:
  (a) in either order, forming the silicon nanowire and the two electrical contact pads contacting the ends of the silicon nanowire;
  (b) introducing the plurality of molecules to the surface of the silicon nanowire and allowing the plurality of molecules to self-assemble on the surface; and either
  (c1) reversibly changing the dipole moment of the molecules to modulate the electrical conductivity of the silicon nanowire; or
  (c2) reversibly transferring electrons between the molecules and the silicon nanowire.

The concept of molecular self-assembly is applied in attaching functional molecules onto silicon nanowire surfaces, and the requirement of molecule modification (e.g., hydroxy group in molecules) is minimal from the point view of synthetic difficulty and compatibility. Self-assembly will produce well-ordered ultra-thin films with strong chemical bonding on a surface that cannot be easily achieved by other conventional methods.

The incorporation of nano-imprinting technique to fabricate nano-silicon wires will be a practical route in mass production that most other nano-wire formation methods cannot achieve.

The present teachings offer a molecule-silicon hybrid electronic system, and utilize organic or organo-metallic molecules to modulate the semi-conductor electronic properties in the nano regime, which could potentially produce optical sensing devices with much higher density and sensitivity.

BRIEF DESCRIPTION OF THE DRAWINGS

FIGS. 1a-1d depict the process steps in the formation of a nano-optical sensor based on molecular self-assembly on the silicon nano-wire surface, where one mechanism of sensing is depicted in FIG. 1c and a second mechanism of sensing is depicted in FIG. 1d;

FIGS. 5a-5d depict one embodiment of a route to self-assembly molecules onto silicon nanowire surfaces, here showing molecules having a hydroxyl (—OH) group; and FIGS. 6a-6c depict an alternate embodiment of a route to self-assembly of molecules onto silicon nanowire surfaces.

BEST MODES FOR CARRYING OUT THE INVENTION

Figure 1C:
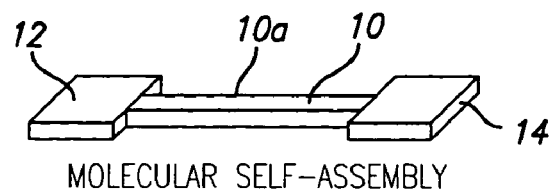
Figure 1C:
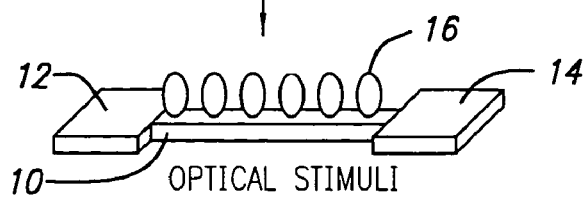
Figure 1C:
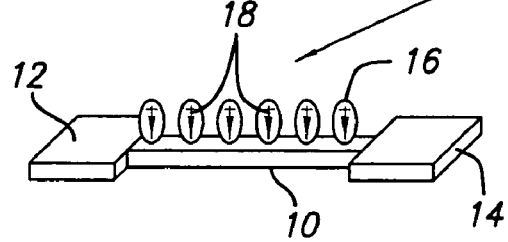

Reference is made now in detail to specific embodiments, which illustrates the best mode presently contemplated by the inventors for practicing the invention. Alternative embodiments are also briefly described as applicable.

Definitions

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM) or a color pixel in a display.

The term "bi-stable" as applied to a molecule means a molecule having two relatively low energy states (local minima) separated by an energy (or activation) barrier. The molecule may be either irreversibly switched from one state to the other (singly configurable) or reversibly switched from one state to the other (recorifigurable). The term "multi-stable" refers to a molecule with more than two such low energy states, or local minima.

The term "micron-scale dimensions" refers to dimensions that range from 1 micrometer to a few micrometers in size.

The term "sub-micron scale dimensions" refers to dimensions that range from 1 micrometer down to 0.05 micrometers.

The term "nanometer scale dimensions" refers to dimensions that range from 0.1 nanometers to 50 nanometers (0.05 micrometers).

Micron-scale and submicron-scale wires refer to rod or ribbon-shaped conductors or semiconductors with widths or diameters having the dimensions of 0.05 to 10 micrometers, heights that can range from a few tens of nanometers to a micrometer, and lengths of several micrometers and longer.

An optical switch, in the context of the present invention, involves changes in the electromagnetic properties of the molecules, both within and outside that detectable by the human eye, e.g., ranging from the far infra-red (IR) to deep ultraviolet (UV). Optical switching includes changes in properties such as absorption, reflection, refraction, diffraction, and diffuse scattering of electro-magnetic radiation.

Optical Sensors

As semiconductor features are brought down into the nano scale, the semiconductor surface itself will dictate the electronic properties of the nano structure. The traditional inorganic surface treatments, such as annealing, passivation, and doping, have faced some practical difficulties in achieving homogeneous and controllable level of modifying semiconductor electronic properties.

In the present embodiments discussed herein, a novel optical sensor, or detector, is described, based on organic or organo-metallic molecular self-assembly onto a silicon nano-wire surface. The selected molecules can absorb photons at certain wavelengths and then either undergo photochemical reaction to generate a large dipole moment or assist the photo-energy/electron transfer into the silicon, both of which will consequently tailor the electron or hole transportation inside the silicon nano-wire. Therefore, optical stimuli will be realized by a (sudden) change in the measured conductivity of the silicon nano-wire. If the molecules undergo photochemical reaction, such reaction needs to be reversible under certain conditions such as thermal treatment or exposure to light with different wavelengths.

By using the photochromic organic molecules (e.g., spiropyran, azo-dyes, etc.) disclosed herein, which can alter the dipole of molecules dramatically (also reversibly) under optical stimuli, or by using the photosensitizer molecules (such as porphyrins, phthalocyanines, anthraquinones, or cyanines, etc.), which can enhance the photoelectron and excitation energy transfer to the conduction band of the silicon nanowire under light with certain wavelengths, then two novel ways are provided to modulate the electronic properties of nano-silicon wires. Therefore, a molecule-silicon hybrid optical sensing device (sensor or detector) is conceivable.

Another important factor worth mentioning in connection with the current embodiments is the size of silicon wires; only when the wire reaches the nanometer regime where the surface volume is comparable with the bulk volume of the wire, will the surface-attached molecules play a critical role in tuning the electronic properties of silicon nano-wires. Hence, the incorporation of nano-imprinting techniques developed by Yong Chen (U.S. Pat. No. 6,432,740 places the present teachings in a more practical position than other methods of fabricating nano objectives such as CVD method of growing nanowires, laser-ablation growth of nanowires, etc.

Figure 1D:
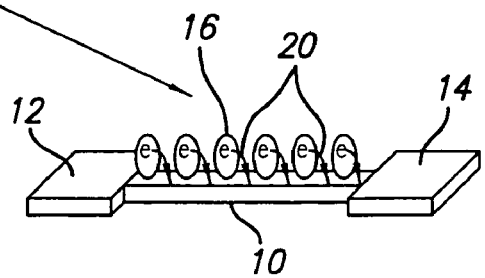

FIGS. 1a-1d illustrate the process flow in the fabrication of nano-optical sensors. FIG. 1a depicts a silicon nanowire 10 connecting two electric contact pads 12, 14 at either end. Molecules 16 are introduced into the system, and are formed on the surface 10a of the silicon nanowire 10 by molecular self-assembly, as shown in FIG. 1b. The molecules 16 are in an initial state. FIGS. 1c and 1d depict the situation when the molecules 16 are in an active state via one of two different mechanisms. In FIG. 1c, the conductivity of the silicon nanowire 10 is modulated by the dipole of the molecules (shown with the arrows 18). In FIG. 1d, the conductivity of the silicon nanowire 10 is modulated by a molecule-assisted electron/energy transfer (shown with the arrows 20 moving from the molecule 16 onto the silicon nanowire 10). In the foregoing figures, the silicon nanowire 10 and contact pads 12, 14 are all supported on a substrate (not shown).

Silicon nano-wires 10 as narrow as 10 nm and as thin as 10 nm but as long as several micrometers can be patterned onto an insulating silicon dioxide substrate surface (not shown) by utilizing a combination of e-beam lithography and nano-imprinting techniques. In general, the silicon nano wires 10 can be as large as 50 nm in width and as large as 100 nm in thickness, but smaller dimensions are preferred, for the reasons mentioned above. The terminal electric contact pads 12, 14 can be any conducting material, such as a metal, e.g., aluminum, which can be achieved by physical vapor deposition through well-aligned shadow masks.

Nano-imprinting to form silicon nanowires 10 is preferably employed in forming the silicon nanowires. An example of the fabrication of such silicon nanowires by nano-imprinting is disclosed in U.S. Pat. No. 6,432,740, entitled "Fabrication of Molecular Electronic Circuit by Nanoimprinting", issued on Aug. 13, 2002, to Yong Chen and assigned to the same assignee as the present application. The contents of that patent are incorporated herein by reference.

Figure 2:
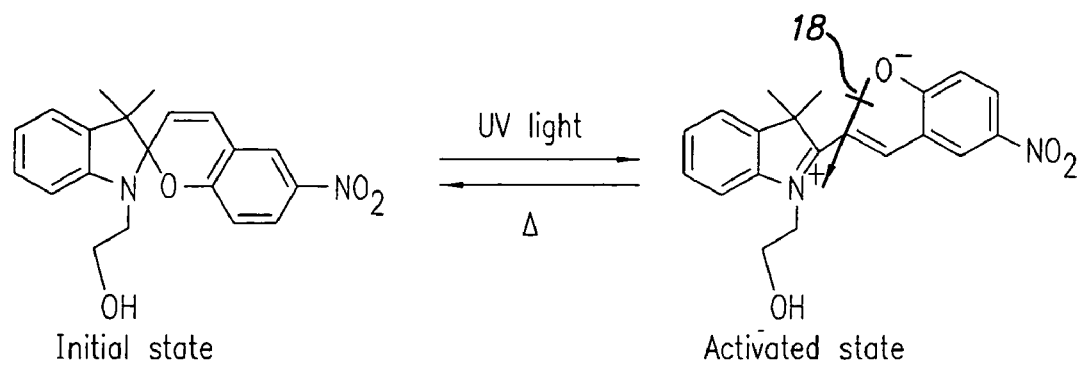
FIG. 2 depicts the dipole generation in a spiropyran molecule under UV irradiation and the reverse of the reaction under thermal treatment.

Two classes of mechanisms are disclosed herein to modulate the electrical conductivity of nano semiconductor wires 10 after being exposed to optical stimuli such as UV light. In the first case, a direct photochemical reaction can happen in the surface-bound molecules 16, and consequently a strong dipole will generate inside the molecules. A typical example of molecules with such a property are the spiropyran dyes, a well-studied photochromic dye system. Both the structure and its property of a spiropyran dye are shown in FIG. 2. Under UV irradiation, spiropyran undergoes a ring-opening reaction, which forms a negative charge (at what was the ring oxygen) and a positive charge (at the ring nitrogen). The dipole 18 that forms is indicated by the arrow +→. It will be noted that the two charges are at different locations on the molecule. Naturally, a strong dipole 18 inside the molecule will build up a local surface electric field on the nano silicon wire 10, which in turn will tailor the electronic conductivity of the semiconductor just like a gate voltage will do to a three terminal semiconductor field effect transistor (FET). More importantly, by gently heating the activated spiropyran molecule (indicated by Δ), the initial state spiropyran will be regenerated. Thus, a reversible optical sensing device based on such mechanism can be realized.

Figure 3:
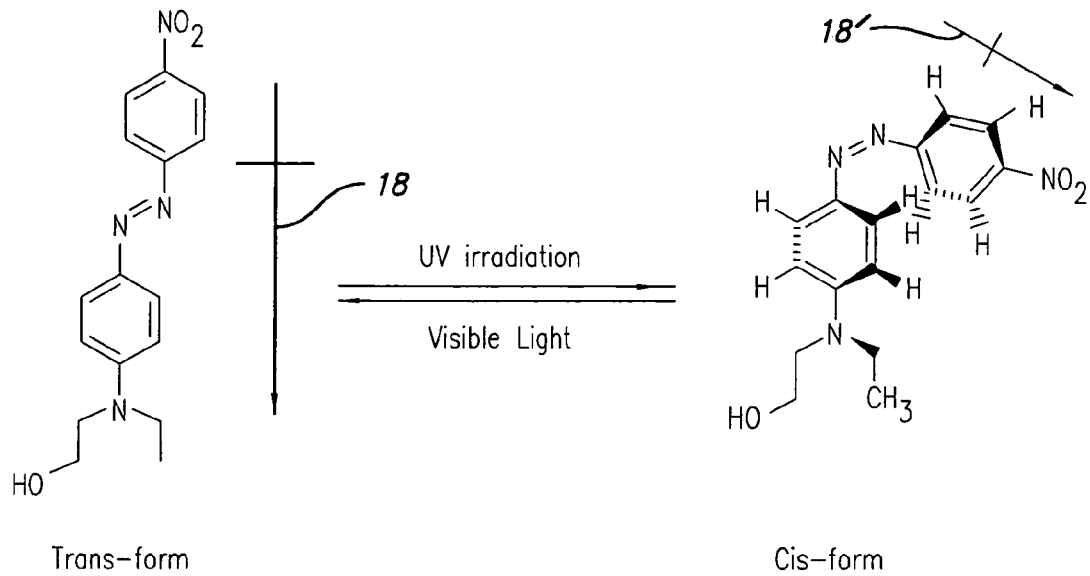
FIG. 3 depicts the dipole generation in an azo-dye system, where the azo-dye undergoes a reversible cis-trans photo-isomerization under a different light irradiation, with a larger dipole built-up within the molecule in its trans-form, and a much smaller dipole will result in its cis-form.

Another example of a molecule 16 with the dipole-forming property is the azo-dye system. The structure and its property of one typical azo-dye molecule are shown in FIG. 3. This azo-dye can undergo a reversible cis-trans photo-isomerization under different light irradiations. A larger dipole 18 will be built-up within the molecule in its trans-form, and a much smaller dipole 18' will result from its cis-form. The cis-form is generated by exposure to UV irradiation, while the trans-form is generated by exposure to visible light irradiation. Both forms are bi-stable, and the big difference in its molecular dipole, as denoted by the relative size of the arrows +→, will change the local electric field on the surface of the nano-wire 10, which in turn will tailor the electronic conductivity of the semiconductor just like a gate voltage will do to a three terminal semiconductor FET.

Figures 4A, 4B:
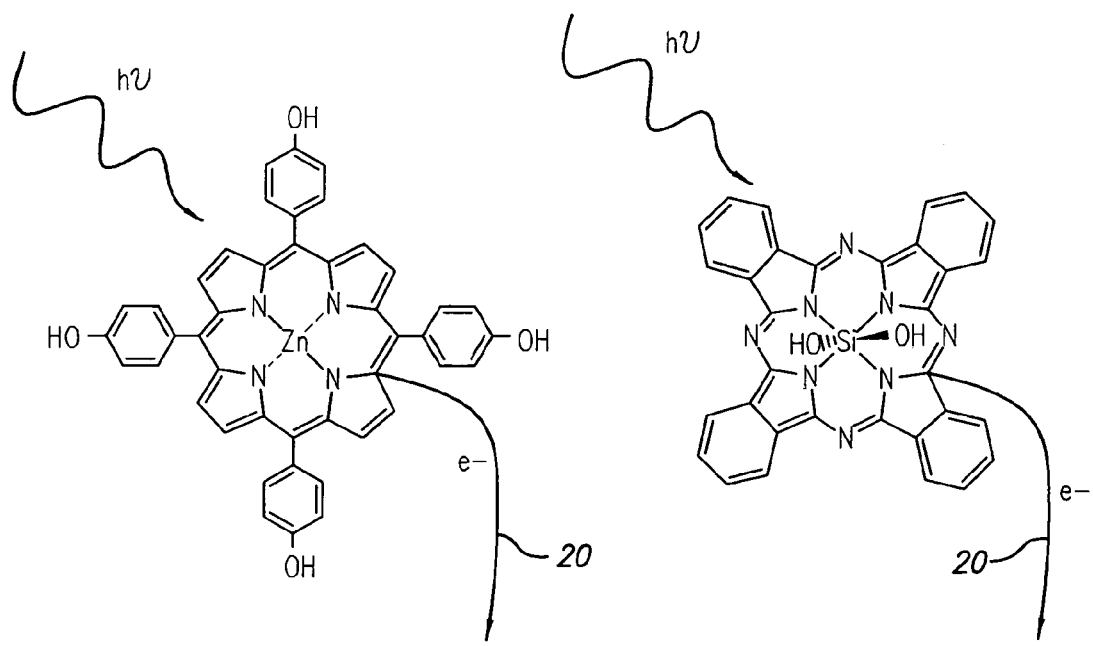
FIGS. 4a and 4b depict the molecular-assisted electron/energy transfer into the nanowire in the example of a porphyrin and a phthalocyanine, respectively.

The second proposed mechanism is based on the molecular-facilitated electron or energy transfer to the nano silicon wire 10, which will then increase or deplete the number of carriers in the wire, depending on the doping type of the wire. The utilization of those organic or organo-metallic molecules 16 presents a versatile way to enhance the quantum yield of the photo input to the molecule-silicon hybrid system. For example, photosensitizer molecules 16 (such as porphyrins, phthalocyanines, anthraquinones, or cyanines etc.), have a very high efficiency of absorbing visible light; they can act as photo antenna, which can then transfer the photo-energy they adsorbed into the nanowire 10 in the form of photo-electrons or excitation energy 20 that silicon can absorb easily. In addition, the maximum absorption wavelength of these molecules 16 can be easily fine-tuned by modifying the molecular structure only slightly. As the size of the silicon wire 10 shrinks to the nanometer regime, the amount of carriers inside the wire will be comparable to the number of molecules 16 on the wire surface, and the electrons transferred from the molecules on the surface of the wire will considerably tailor the electronic properties of the silicon nano wire. This is illustrated in FIG. 4a (for porphyrin) and FIG. 4b (for phthalocyanine). This second mechanism is also reversible, with electrons/energy 20 transferring from the silicon nano wire 10 to the molecules 16.

In order to achieve any one of the above-proposed sensing mechanisms highly effectively, molecule self-assembly is crucial for binding functional molecules onto the surfaces of silicon nanowires 10. Such functional molecules all have an —OH functional group for binding to the silicon surface 10a. However, the —OH group is only one of the many functional groups that can be used for this type of self-assembly, and is presented here for illustration purposes only. Other types of functional groups can also be used for the same purpose, including, but not limited to, —SH, —NH$_2$, —CO$_2$H, —CONH$_2$, —Si(OMe)$_3$, —Si(OEt)$_3$, —SiCl$_3$, —COCH=CH$_2$, —OCOCH=CH$_2$, -pyridine, and heterocycles with at least one hetero atom in the ring such as N, O, S, etc., where Me=methyl and Et=ethyl.

The molecules 16 employed in the practice of these embodiments is represented by the formula R—X, where R is any moiety, whether hydrocarbon or substituted hydrocarbon, acyclic or cyclic or aromatic, with or without at least one heteroatom, and where X is any of the functional groups listed in the preceding paragraph.

Self-assembly of molecules 16 will provide an ultra thin film on the silicon surface with ordered molecular arrays, which can maximize the effect of surface electric field generated by the dipole of the molecules. Also, self-assembly will form chemical bonding between molecules 16 and silicon surface 10a so as to yield a rigid and stable film, which cannot be achieved by many other methods such as spin coating, cast-film, or Langmuir-Blodgeft film. As used herein, self-assembly involves the formation of covalent bonding between functional groups in the molecule and the terminal groups in the substrate, whereas other methods do not form chemical bonding.

FIGS. 5a-5d and 6a-6c illustrate two general routes to the self-assembly of molecules 16 onto silicon nanowire surfaces 10a so long as the molecule has the appropriate above-described functional group, such as a hydroxyl group, which is very easy to accomplish synthetically.

Two well-characterized silicon surfaces can be obtained either with or without a native oxide layer. FIGS. 5a-5d depict the situation with a native oxide layer 22 on the silicon nanowire 10, while FIGS. 6a-6c depict the situation without such a native oxide layer.

For a silicon surface 10a with a native oxide layer 22 (typical thickness of about 1 nm), a wet treatment with a "piranha" solution (1:1 mixture of sulfuric acid and hydrogen peroxide) generates hydroxide-terminated (—OH) surface groups 24, which can be further treated with tetrachlorosilane (SiCl$_4$) in a dry solvent to provide surface-active Si—Cl bonds. Alternatively, and preferably, a water plasma is employed in place of the piranha solution. Previous studies have indicated that molecules with hydroxy groups can react toward Si—Cl bonds. Therefore, as long as one can modify functional molecules with a hydroxy group, which is readily achievable synthetically, an ordered molecular layer can be assembled onto silicon nano wire surfaces. Alternatively, as discussed above, other functional moieties may be used in place of —OH to accomplish the same purpose.

For a silicon surface 10a without a native oxide (removal of the native oxide is accomplished by hydrofluoride etching), a surface with hydrogen termination groups is normally considered. A direct chlorine passivation treatment under high temperature (greater than 500° C.) in the atmosphere of hydrochloride and hydrogen mixture will yield chloride-terminated (—Cl) surface groups 26. Therefore, similar surface attachment of functional molecules (R—OH) 16 onto the silicon surface 10a can be achieved as previously discussed.

It will be appreciated that the structures depicted in FIGS. 5c and 6b are essentially equivalent in presenting a chloride-termination for reaction with the functional group (here, —OH).

INDUSTRIAL APPLICABILITY

The optical sensor and methods of making the same are expected to find use in nano-scale technology applications.

What is claimed is:

1. A method of making an optical sensor comprising (a) a silicon nanowire of finite length having an electrical contact pad at each end thereof and (b) a plurality of self-assembled photo-polarizable molecules on a surface of said silicon nanowire, said molecules serving to modulate electrical conductivity of said silicon nanowire by either a reversible change in dipole moment of said photo-polarizable molecules or by a reversible molecule-assisted electron/ energy transfer from said photo-polarizable molecules onto said silicon nanowire, said method comprising:

(a) in either order, forming said silicon nanowire and said two electrical contact pads contacting said ends of said silicon nanowire;

(b) introducing said plurality of photo-polarizable molecules to said surface of said silicon nanowire and allowing said plurality of photo-polarizable molecules to self-assemble on said surface;

(c) exposing the coated silicon nanowire to at least one of optical radiation and heat; and either (d1) reversibly changing said dipole moment of said photo-polarizable molecules to modulate said electrical conductivity of said silicon nanowire; or (d2) reversibly transferring electrons between said photo-polarizable molecules and said silicon nanowire, such that said photo-polarizable molecules undergo a reversible response to at least one of said optical radiation and heat.

2. The method of claim 1 wherein said electrical conduclivity of said silicon nanowire is modulated by a reversible change in dipole moment of said molecules.

3. A method of making an optical sensor comprising (a) a silicon nanowire of finite length having an electrical contact pad at each end thereof and (b) a plurality of self-assembled molecules on a surface of said silicon nanowire, said molecules serving to modulate electrical conductivity of said silicon nanowire by either a reversible change in dipole moment of said molecules or by a reversible molecule-assisted electron/energy transfer from said molecules onto said silicon nanowire, said method comprising:

(a) in either order forming said silicon nanowire and said two electrical contact pads contacting said ends of said silicon nanowire;

(b) introducing said plurality of molecules to said surface of said silicon nanowire and allowing said plurality of molecules to self-assemble on said surface;

(c) exposing the coated silicon nanowire to at least one of optical radiation and heat; and either (d1) reversibly changing said dipole moment of said molecules to modulate sold electrical conductivity of said silicon nanowire: or (d2) reversibly transferring electrons between said molecules and said silicon nanowire, wherein said electrical conductivity of said silicon nanowire is modulated by a reversible change in dipole moment of said molecules, wherein said dipole moment is created by exposure of said molecules in an initial state to UV light to form an activated state and is destroyed by exposure of said molecules in said activated state to heat to return to said initial state.

4. The method of claim 3 wherein said activated state is formed by a ring-opening reaction upon exposure to said UV light, which forms a negative charge on a ring oxygen and a positive charge on a ring nitrogen.

5. The method of claim 4 wherein said molecules comprise a Spiropyran.

6. A method of making an optical sensor comprising (a) a silicon nanowire of finite length having an electrical contact pad at each end thereof and (b) a plurality of self-assembled molecules on a surface of said silicon nanowire, said molecules serving to modulate electrical conductivity of said silicon nanowire by either a reversible change in dipole moment of said molecules or by a reversible molecule-assisted electron/energy transfer from said molecules onto said silicon nanowire, said method comprising:

(a) in either order, forming said silicon nanowire and said two electrical contact pads contacting said ends of said silicon nanowire;

(b) introducing said plurality of molecules to said surface of said silicon nanowire and allowing said plurality of molecules to self-assemble on said surface;

(c) exposing the coated silicon nanowire to at least one of optical radiation and heat and either (d1) reversibly changing said dipole moment of said molecules to modulate said electrical conductivity of said silicon nanowire; or (d2) reversibly transferring electrons between said molecules and said silicon nanowire, wherein said electrical conductivity of said silicon nanowire is modulated by a reversible change in dipole moment of said molecules, wherein said molecules have a cis-form and a trans-form and wherein UV irradiation converts said trans-form to said cis-form and wherein visible light irradiation converts said cis-form to said trans-form.

7. The method of claim 6 wherein said molecules comprise an azo-dye system.

8. The method of claim 1 wherein said electrical conductivity of said silicon nanowire is modulated by a reversible molecule-assisted electron/energy transfer to/from said molecules onto said silicon nanowire.

9. The method of claim 8 wherein molecules are selected from the group consisting of porphyrins, phthalocyanines, anthraquinones, and cyanines.

10. The method of claim 1 wherein said silicon nanowire has a native oxide on its surface prior to introducing said molecules.

11. The method of claim 10 wherein hydroxide-terminated surface groups are formed on said native oxide.

12. The method of claim 11 wherein said hydroxide-terminated surface groups are formed by exposing said native oxide to a water plasma.

13. The method of claim 11 wherein said hydroxide-terminated surface groups are treated to form surface-active Si-Cl bonds.

14. The method of claim 13 wherein said surface-active Si-Cl bonds are formed by treating said hydroxide-terminated surface groups with tetra-chlorosilane to form terminal —Cl groups.

15. The method of claim 14 wherein said terminal —Cl groups are reacted with molecules having the formula R—X, where R is any moiety, whether hydrocarbon or substituted hydrocarbon, acyclic or cyclic or aromatic, with or without at least one heteroatom, and where X is selected from the group consisting of —OH, —SH, —NH$_2$, —CO$_2$H, —CONH$_2$, —Si(OMe)$_3$, —Si(OEt)$_3$, —SiCl$_3$, —COCH=CH$_2$, —OCOCH=CH$_2$, —pyridine, and heterocycles with at least one hetero atom in the ring and selected from the group consisting of N, O, S, where Me=methyl and Et=ethyl.

16. The method of claim 15 wherein X=—OH.

17. The method of claim 1 wherein said silicon nanowire is devoid of any native oxide on its surface prior to introducing said molecules, but has hydrogen termination groups thereon.

18. The method of claim 17 wherein said hydrogen-terminated groups are converted to chlorine-terminated groups.

19. The method of claim 18 wherein said chlorine-terminated groups are formed by treating said hydrogen-terminated groups with a mixture of hydrochloride and hydrogen at a temperature of at least 500° C.

20. The method of claim 19 wherein said chlorine-terminated groups are treated with said molecules having the formula R—X, where R is any moiety, whether hydrocarbon or substituted hydrocarbon, acyclic or cyclic or aromatic, with or without at least one heteroatom, and where X is selected from the group consisting of —OH, —SH, —NH$_2$, —CO$_2$H, —CONH$_2$, —Si(OMe)$_3$, —Si(OEt)$_3$, —SiCl$_3$, —COCH═CH$_2$, —OCOCH═CH$_2$, —pyridine, and heterocycles with at least one hetero atom in the ring and selected from the group consisting of N, O, S, where Me=methyl and Et=ethyl.

21. The method of claim 20 wherein X═—OH.

22. The method of claim 1 wherein said optical sensor is a photodetector.

* * * * *

UNITED STATES PATENT AND TRADEMARK OFFICE
CERTIFICATE OF CORRECTION

PATENT NO. : 7,294,526 B2 Page 1 of 1
APPLICATION NO. : 10/917751
DATED : November 13, 2007
INVENTOR(S) : Zhiyong Li et al.

It is certified that error appears in the above-identified patent and that said Letters Patent is hereby corrected as shown below:

In column 3, line 10, delete "(recorifigurable)" and insert -- (reconfigurable) --, therefor.

In column 6, line 10, delete "Blodgeft" and insert -- Blodgett --, therefor.

In column 7, lines 20-21, in Claim 2, delete "conduclivity" and insert -- conductivity --, therefor.

In column 7, line 33, in Claim 3, after "order" insert -- , --.

In column 7, line 43, in Claim 3, delete "sold" and insert -- said --, therefor.

In column 7, line 44, in Claim 3, after "nanowire" delete ":" and insert -- ; --, therefor.

In column 7, line 60, in Claim 5, delete "Spiropyran." and insert -- spiropyran. --, therefor.

In column 8, line 11, in Claim 6, after "heat" insert -- ; --.

In column 8, line 47, in Claim 14, delete "tetra-chlorosilane" and insert -- tetrachlorosilane --, therefor.

Signed and Sealed this

Twenty-second Day of July, 2008

JON W. DUDAS
*Director of the United States Patent and Trademark Office*